(12) United States Patent
Otani et al.

(10) Patent No.: US 7,078,756 B2
(45) Date of Patent: Jul. 18, 2006

(54) COLLARLESS TRENCH DRAM DEVICE

(75) Inventors: Yoichi Otani, Wappingers Falls, NY (US); Herbert L. Ho, New Windsor, NY (US); Babar A. Khan, Ossining, NY (US); Paul C. Parries, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/904,933

(22) Filed: Dec. 6, 2004

(65) Prior Publication Data

US 2006/0118850 A1    Jun. 8, 2006

(51) Int. Cl.
*H01L 27/108* (2006.01)

(52) U.S. Cl. .................. 257/296; 257/301; 257/305

(58) Field of Classification Search ............ 257/296, 257/301–305
See application file for complete search history.

(56) References Cited

U.S. PATENT DOCUMENTS

| | | | |
|---|---|---|---|
| 4,943,728 A * | 7/1990 | Dykstra et al. ......... | 250/492.3 |
| 5,909,044 A | 6/1999 | Chakravarti et al. | |
| 6,018,174 A * | 1/2000 | Schrems et al. ........... | 257/296 |
| 6,204,112 B1 | 3/2001 | Chakravarti et al. | |
| 6,261,894 B1 | 7/2001 | Mandelman et al. | |
| 6,368,912 B1 | 4/2002 | Chang et al. | |
| 6,404,400 B1 | 6/2002 | Tulloch | |
| 6,420,239 B1 | 7/2002 | Weis | |
| 6,432,774 B1 | 8/2002 | Heo et al. | |
| 6,440,793 B1 | 8/2002 | Divakaruni et al. | |
| 6,452,224 B1 * | 9/2002 | Mandelman et al. ....... | 257/296 |
| 6,566,190 B1 | 5/2003 | Lee et al. | |
| 6,573,561 B1 | 6/2003 | Chidambarrao et al. | |
| 6,599,798 B1 * | 7/2003 | Tews et al. ................ | 438/249 |
| 6,630,379 B1 | 10/2003 | Mandelman et al. | |
| 6,818,534 B1 * | 11/2004 | Davis et al. ................ | 438/521 |
| 6,853,025 B1 * | 2/2005 | Tews et al. ................ | 257/303 |
| 2002/0004271 A1 | 1/2002 | Weis | |
| 2002/0190298 A1 * | 12/2002 | Alsmeier et al. ........... | 257/301 |
| 2004/0021163 A1 | 2/2004 | Bonart et al. | |
| 2005/0026359 A1 * | 2/2005 | Voigt et al. ................ | 438/243 |

OTHER PUBLICATIONS

Pending IBM Application Entitled "Vertical SOI Device", U.S. Appl. No. 10/710,166, filed Jun. 23, 2004.
Adler et al., The evolution of IBM CMOS DRAM technology, IBM Journal of Research and Development, Jan. 1995, pp. 167-188, vol. 39, No. 1/2.

* cited by examiner

*Primary Examiner*—T. N. Quach
(74) *Attorney, Agent, or Firm*—Joseph P. Abate; Mark R. Bilak

(57) ABSTRACT

The present invention provides collarless trench semiconductor memory devices having minimized vertical parasitic FET leakage and methods of forming the same.

20 Claims, 7 Drawing Sheets

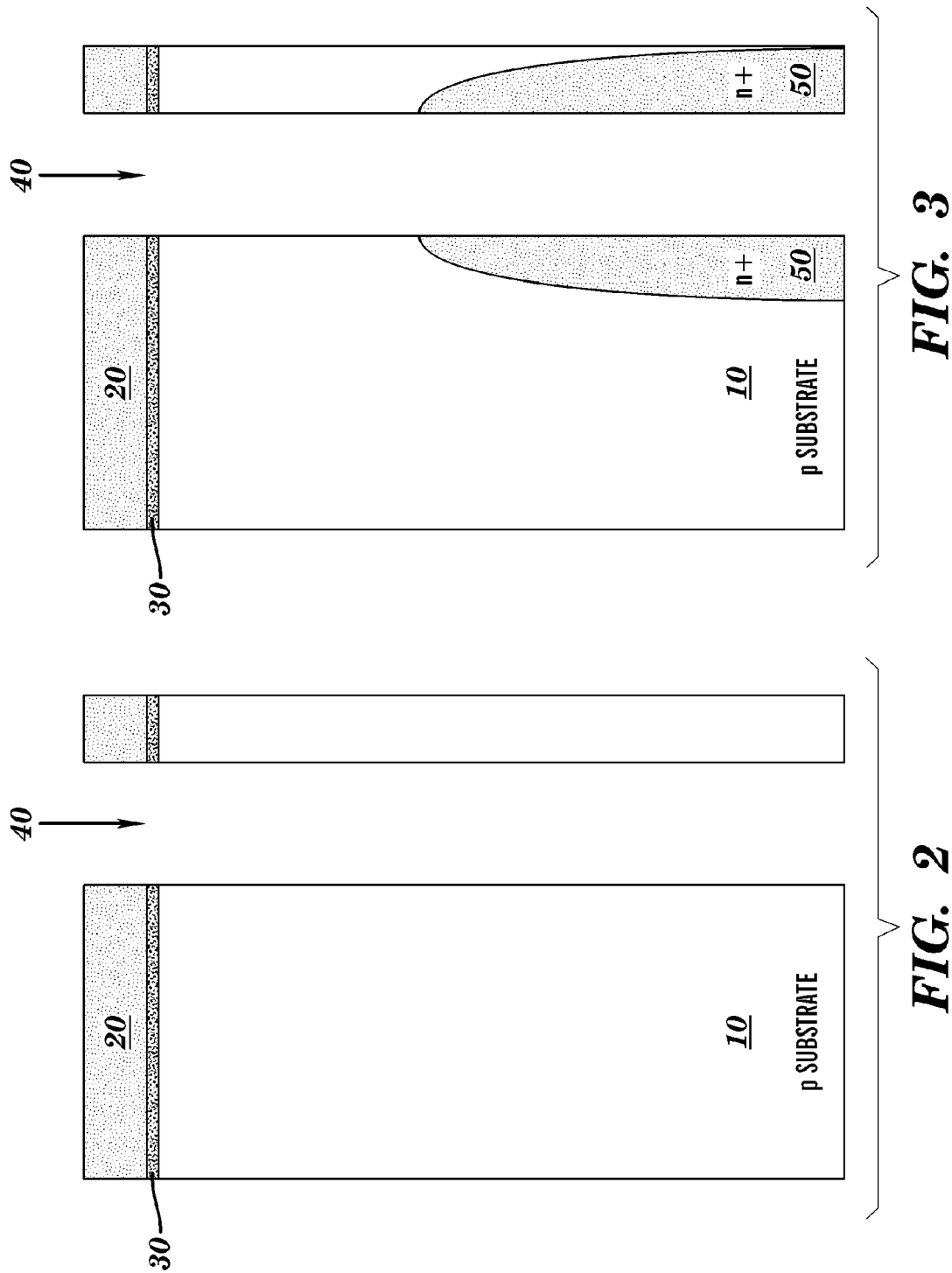

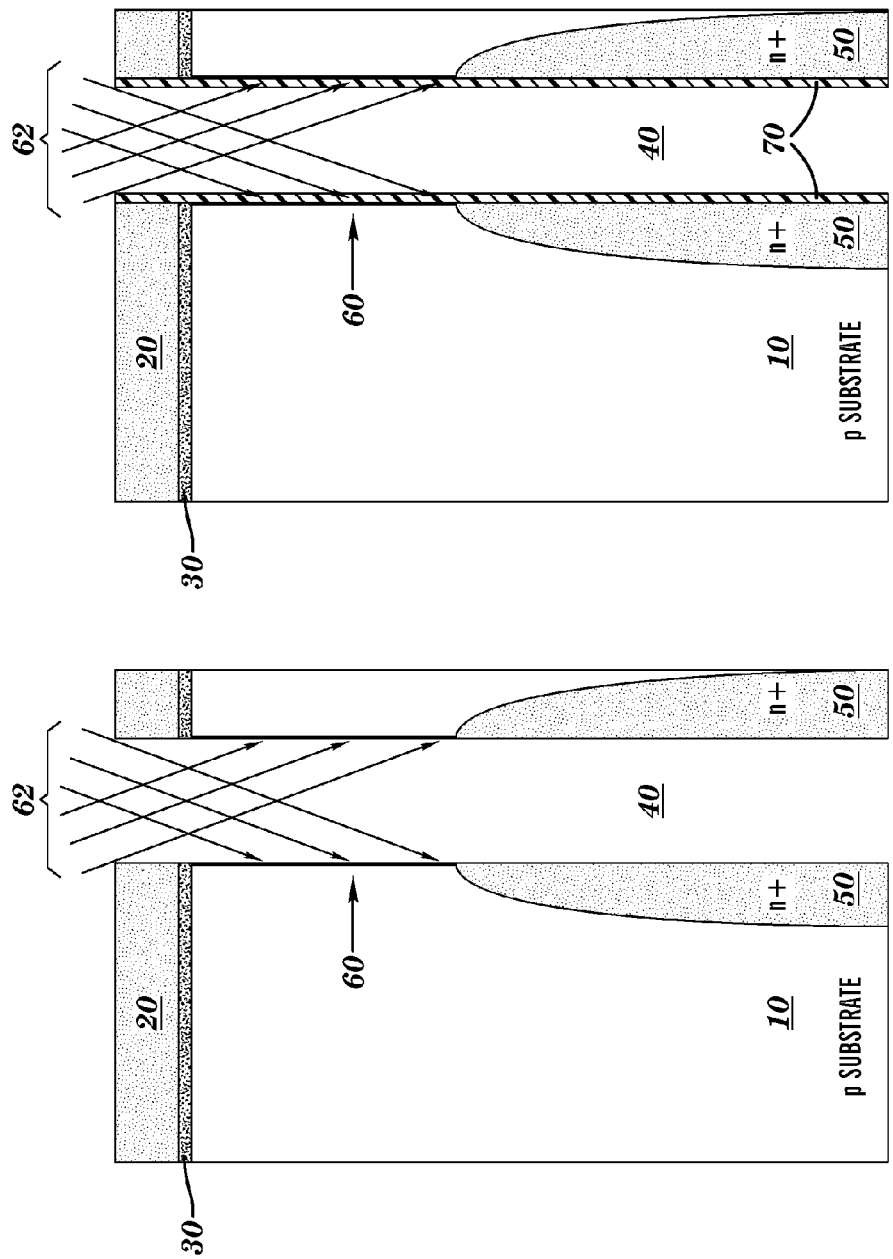

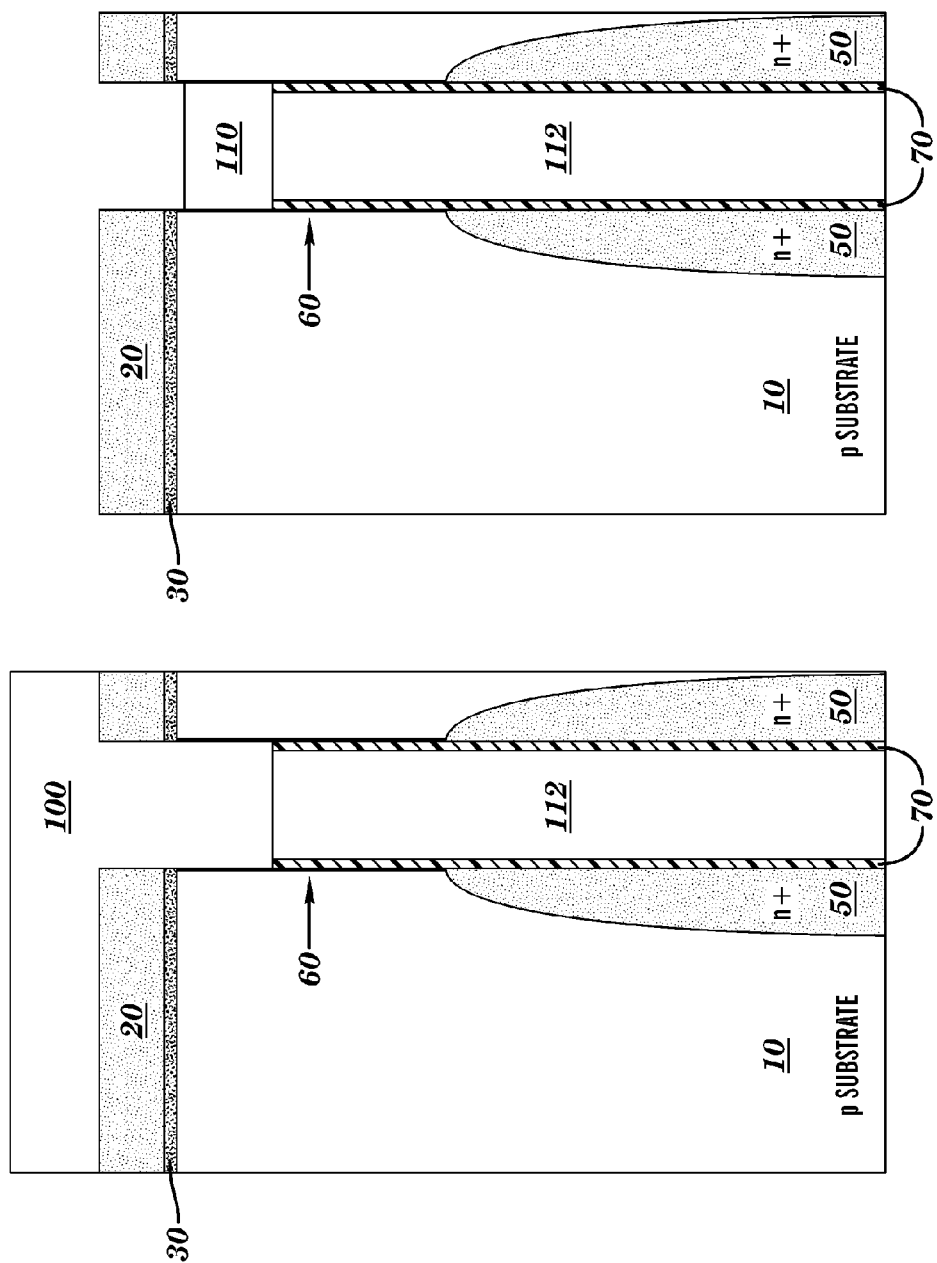

COLLARLESS TRENCH DRAM DEVICE

BACKGROUND OF THE INVENTION

Technical Field

The present invention relates to semiconductor devices and methods of manufacturing the same, and more particularly, to collarless trench memory devices having minimized vertical parasitic FET leakage and methods of manufacturing the same.

Dynamic random access memory (DRAM) cells, including embedded DRAM (eDRAM) cells, typically include an access field-effect transistor (FET) and a storage capacitor. The access FET allows the transfer of data to and from the storage capacitor during write and read operations. The data stored on the storage capacitor is periodically refreshed during a refresh operation. One type of storage capacitor for DRAM/eDRAM cells is a trench capacitor. A trench capacitor is formed in an opening in a semiconductor substrate, often referred to as a deep trench. The use of trench capacitors minimizes the overall size of a conventional memory cell. For example, U.S. Pat. No. 5,909,044 (the '044 patent) issued to the assignee hereof, entitled "Process for forming a high density semiconductor device" discloses such a trench capacitor structure. FIG. 2 of the '044 patent illustrates a polysilicon-filled trench 42 formed in a silicon substrate 2.

Conventional DRAM/eDRAM processing has become very complex in order to make high performance and highly reliable trench capacitors. Increased process complexity translates into increased overall process cost and potentially reduced yields. A prime example of this problem can be observed in the process of creating a trench capacitor. One of the key parameters for DRAM/eDRAM cells is retention time. Retention time refers to the amount of time a capacitor can hold charge before having to be refreshed because of charge leakage. In order to maintain sufficient retention time for DRAM/eDRAM cells, charge leakage must be sufficiently suppressed. One such leakage path that specifically applies to trench-based DRAM/eDRAM cells is vertical parasitic FET leakage that can form along the trench sidewalls under certain operating conditions.

The vertical parasitic FET formed in trench DRAM/eDRAM cells is a vertical device that exists along the upper sidewall region of the deep trench about 1 um to 1.5 um below the substrate surface. For example, U.S. Pat. No. 6,368,912 (the '912 patent) issued to Nanya Technology Corporation, entitled "Method of fabricating an isolation structure between a vertical transistor and a deep trench capacitor" discloses such a vertical FET. FIG. 1G of the '912 patent illustrates a vertical parasitic FET formed by doped region 180, collar oxide 145, lower capacitor electrode 130 (also a doped region), and the portion of the silicon substrate 100 disposed between doped region 180 and lower capacitor electrode 130 (i.e. the vertical transistor channel). Again referring to FIG. 1G of the '912 patent, doped region 180 represents the drain of the vertical FET, lower capacitor node 130 represents the source of the vertical device, and doped polysilicon region 150 formed in the deep trench acts as the gate of the device. DRAM/eDRAM cells are typically built in P-type semiconductor substrates or isolated in P-wells, and therefore, the vertical FET is a NFET. Vertical parasitic FET leakage can occur when a high-level logic state, commonly referred to as a logic '1', is written into the DRAM/eDRAM cell. When a logic '1' is being written, the channel region of the vertical FET can be inverted underneath the collar oxide region as the bitline voltage (e.g. Vdd) is being stored in the capacitor. If the threshold voltage (Vt) of the vertical device is low enough, the vertical FET can be turned on (i.e. its channel inverted, thus allowing electrons to flow in the device). When the vertical FET is on, electrons are conducted toward the drain of the vertical device, thereby leaking charge off of the trench capacitor and thus deteriorating the retention characteristics of the DRAM/eDRAM cell.

Conventional solutions for minimizing vertical parasitic FET leakage current form a thick collar oxide along the top portion of the deep trench where the vertical FET resides, such as thick collar oxide 145 of FIG. 1G of the '912 patent. A thick collar oxide acts as a thick gate oxide of the vertical parasitic FET, thus making the Vt of the vertical FET high, thereby greatly minimizing parasitic FET leakage. However, the process steps required to form a thick collar oxide are costly and complex. Additionally, requiring a thick collar oxide requires a larger diameter trench polysilicon-fill process, otherwise, the resistance of the trench is increased because the cross-sectional area of the polysilicon-filled trench is narrow. A narrow polysilicon-filled trench increases resistance, thereby increasing the amount of time needed to properly charge the trench capacitor. Thick collar oxides also limit the scaling of DRAM/eDRAM cells. The collar oxide must remain at a certain thickness in order to minimize parasitic vertical FET current leakage.

BRIEF SUMMARY OF THE INVENTION

The present invention thus provides collarless trench semiconductor memory devices having minimized vertical parasitic FET leakage and methods of forming the same that overcome many of the disadvantages of the prior art. Specifically, the semiconductor devices of the present invention minimize vertical parasitic FET leakage. Additionally, the semiconductor devices of the present invention optimize the diameter of polysilicon-filled trenches, thus minimizing the resistance of the trench. Furthermore, the semiconductor devices of the present invention minimize process complexity and cost. Also, the semiconductor devices of the present invention facilitate scaling of memory cells such as DRAM and eDRAM memory cells.

In a first aspect, the invention is a collarless semiconductor memory device having a storage capacitor and a channel stop region for minimizing parasitic leakage.

In a second aspect, the invention is the semiconductor memory device previously described, further comprising a heavily doped well region also for minimizing parasitic leakage.

In a third aspect, the invention is the semiconductor memory devices as previously described, further having a pass-gate device, a wordline, and a bitline.

In a fourth aspect, the invention is a method of forming a collarless semiconductor memory device having a trench capacitor and a channel stop region for minimizing parasitic leakage.

In a fifth aspect, the invention is the previous method of forming a collarless semiconductor memory device further having a heavily doped well region also for minimizing parasitic leakage.

In a sixth aspect, the invention is a method of forming a collarless semiconductor memory device having a trench capacitor and a heavily doped well region for minimizing parasitic leakage.

The foregoing and other advantages and features of the invention will be apparent from the following more particular description of a preferred embodiment of the invention and as illustrated in the accompanying drawings.

BRIEF DESCRIPTION OF THE DRAWINGS

FIGS. 2–11 are partial cross-sectional side views of an embodiment of a collarless trench memory device of the present invention during the fabrication method of FIG. 1.

DETAILED DESCRIPTION OF THE INVENTION

The present invention thus provides collarless trench semiconductor memory devices having minimized vertical parasitic FET leakage and methods of forming the same that overcome many of the disadvantages of the prior art. Specifically, the semiconductor devices of the present invention minimize vertical parasitic FET leakage. Additionally, the semiconductor devices of the present invention optimize the diameter of polysilicon-filled trenches, thus minimizing the resistance of the trench. Furthermore, the semiconductor devices of the present invention minimize process complexity and cost. Also, the semiconductor devices of the present invention facilitate scaling of memory cells such as DRAM and embedded DRAM (eDRAM) memory cells.

The invention will next be illustrated with reference to the figures in which the same numbers indicate the same elements in all figures. Such figures are intended to be illustrative, rather than limiting, and are included to facilitate the explanation of the process and device of the present invention.

Figure 1:
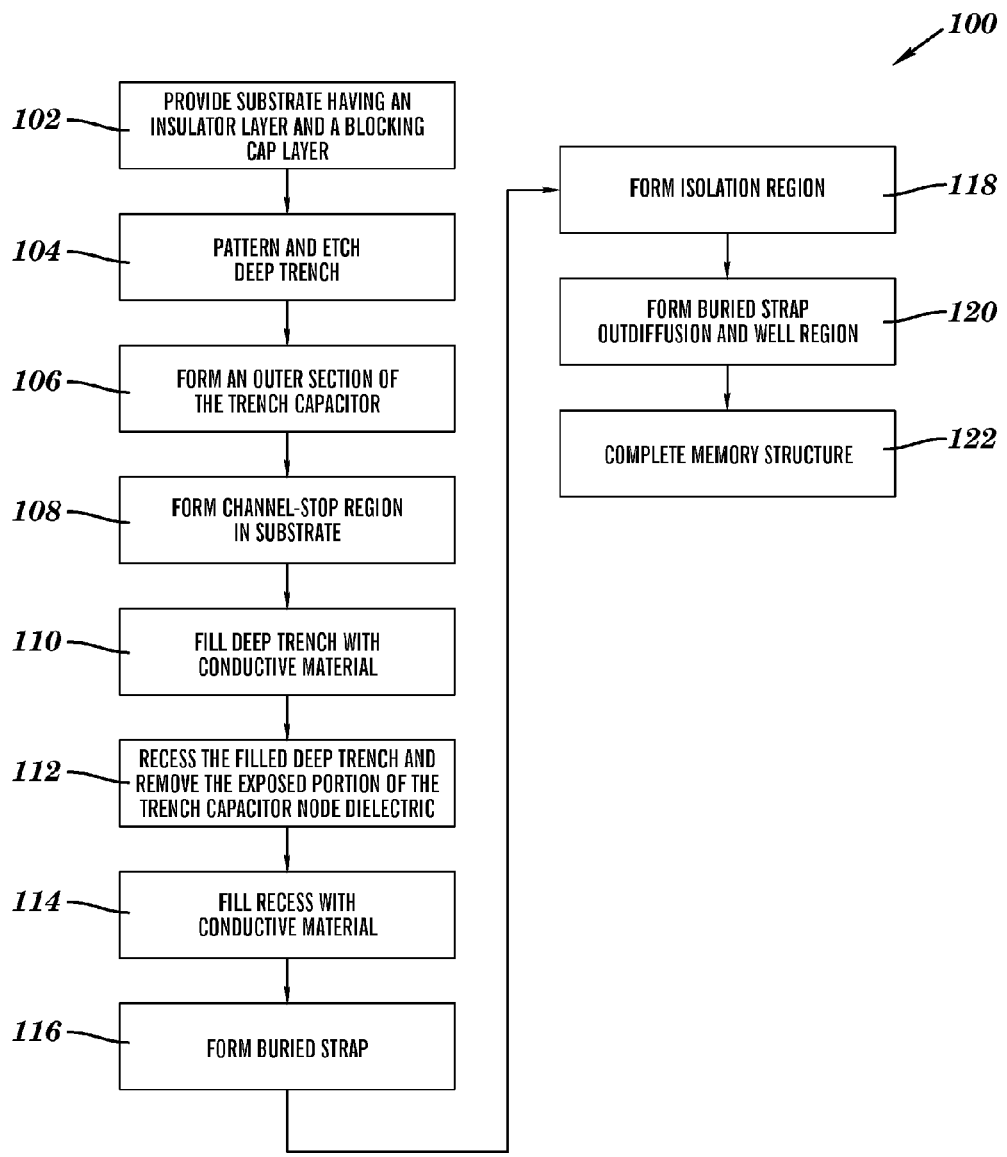
FIG. 1 is a flow diagram illustrating an embodiment of a fabrication method of the present invention.

Turning now to FIG. 1, an exemplary method 100 of forming a collarless trench memory device in accordance with the present invention is illustrated. Any suitable type of memory device can be fabricated according to the present invention such as, for example, DRAM and eDRAM memory devices. The fabrication method 100 facilitates the formation of collarless trench memory devices having minimized vertical parasitic FET current leakage, optimized polysilicon-filled trenches, minimized process complexity and cost, and scalability. Method 100 will now be described in detail, along with examples of one embodiment of a wafer portion during process in FIGS. 2–11.

The first step 102 of FIG. 1 is to provide a suitable semiconductor substrate having an insulator layer formed on the surface of the substrate and a blocking cap layer formed on the insulator layer. The substrate can comprise any semiconductor material, for example: Si, strained Si, $Si_{1-y}C_y$, $Si_{1-x-y}Ge_xC_y$, $Si_{1-x}Ge_x$, Si alloys, Ge, Ge alloys, GaAs, InAs, InP as well as other III–V and II–VI semiconductors. The insulator layer can be any suitable insulating material and is preferably an oxide. The insulator layer can be formed by any conventional thermal growth or deposition process. For example, the insulator layer can be formed by low-pressure chemical vapor deposition (LPCVD), plasma-enhanced CVD (PECVD), or high-density plasma CVD (HD-PCVD). The thickness of the insulator layer can range from approximately 50 Å to 60 Å. The blocking cap layer protects the underlying insulator layer during subsequent processing and can be SiC, nitride, oxynitride, TERA (tunable etch-resistant ARC), or any suitable combination thereof. The blocking cap layer also acts as a hardmask for forming a trench in the underlying insulator layer and the substrate. Preferably, the blocking cap layer comprises nitride. The blocking cap layer can be formed by any suitable conventional processing such as deposition or thermal growth. The thickness of the blocking cap layer can range from approximately 1000 Å to 1800 Å.

The next step 104 of method 100 is to pattern and etch a deep trench into the substrate. The deep trench is formed by patterning and etching the blocking cap layer, the underlying insulator, and a portion of the underlying substrate. Patterning can be done by any suitable process, and would typically involve the deposition and development of a suitable photoresist. The photoresist can be developed using any suitable process such as optical lithography, electron beam lithography, x-ray lithography, or other conventional means for developing the photoresist. After the photoresist has been developed, the blocking cap layer, the underlying insulator layer, and a portion of the underlying substrate can then be etched selective to the developed photoresist using any conventional etch process, for example, reactive ion etch (RIE) or wet etch.

Turning now to FIG. 2, semiconductor substrate 10 is illustrated after nitride cap layer 20, oxide layer 30, and a portion of substrate 10 have been patterned and etched to form deep trench 40. Substrate 10 is only partially shown.

Returning to FIG. 1, the next step 106 is to form an outer conductive node of the trench capacitor in the deep trench. The outer conductive node of the trench capacitor is commonly referred to as a buried plate and can be formed from the substrate as-is or the buried plate can optionally be formed from a doped portion of the substrate. The buried plate can be a portion of the substrate that is heavily doped. The buried plate may be formed by any conventional process, such as gas phase doping, liquid phase doping, plasma doping, plasma immersion ion implantation, outdiffusion doping from a solid film such as arsenic doped silicate glass, or any combination thereof, which are all well known in the art. Optionally, enhancement of the trench capacitance can be done before or after the buried plate is formed. Capacitance can be enhanced by forming a bottle-shape in a lower portion of the deep trench section, roughening the sidewalls of the buried plate by forming hemispherical silicon grains (HSG) thereon, or by any other suitable conventional trench capacitance enhancement method. The combination of two or more of these conventional approaches, such as the combination of bottling and HSG, can be performed.

Turning now to FIG. 3, semiconductor substrate 10 is illustrated after buried plate 50 (partially shown) has been formed in substrate 10. Buried plate 50 will form the outer conductive plate of the trench capacitor.

Returning to FIG. 1, the next step 108 is to form a channel stop region in a portion of the substrate above the buried plate. The channel stop region is formed by implanting a dopant into the substrate along the upper vertical trench surface, where the vertical trench surfaces are typically referred to as sidewalls. The channel stop region is formed to minimize vertical parasitic FET leakage by increasing the P-type concentration along the upper regions of the deep trench where a channel region of the vertical parasitic FET can be formed. By increasing the P-type concentration in the parasitic FET channel region, the threshold voltage (Vt) of the parasitic device is increased, thereby minimizing parasitic device leakage. Preferably, the dopant is Boron (B) or $BF_2$.

The channel stop region can be formed either before or after the trench capacitor node dielectric has been formed. Preferably, the channel stop is implanted after the trench capacitor node dielectric has been formed to eliminate diffusion or movement of the channel stop implant during formation of the trench capacitor node dielectric. The depth of the channel stop implant can be approximately 1 um to 1.5 um below the surface of the trench sidewalls. The channel stop implant is uniformly distributed along upper regions of the deep trench surfaces by implanting the channel stop dopant in a quad-mode with a tilt angle of approximately 7 to 10 degrees from perpendicular to the substrate. The trench capacitor node dielectric can be formed from any suitable dielectric such as nitride, SiN, oxide, thin oxide, oxynitride, thin high-K dielectrics such as Al2O3, ZrO2, and HfO2, or any suitable combination thereof. Conventional techniques such as deposition and/or thermal growth can be used to form the node dielectric.

Turning now to FIG. 4a, semiconductor substrate 10 is illustrated after channel stop region 60 has been formed in substrate 10 along the upper sidewall sections of deep trench 40 before the trench capacitor node dielectric has been formed. Dopant 62 is implanted below the vertical trench surface of substrate 10 to form channel stop region 60. Turning now to FIG. 4b, semiconductor substrate 10 is illustrated after channel stop region 60 has been formed in substrate 10 along the upper sidewall sections of deep trench 40 after trench capacitor node dielectric 70 has been formed. Dopant 62 is implanted below the vertical trench surface of substrate 10 to form channel stop region 60. In both FIG. 4a and FIG. 4b, channel stop region 60 eliminates the need to form a collar oxide for minimizing vertical parasitic FET leakage as described supra.

Returning to FIG. 1, the next step 110 is to fill the deep trench with a conductive material. Any suitable conductive material can be deposited in the deep trench such as doped polysilicon, doped germanium, metals, silicides, or metallic nitrides (e.g., TiN or TaN). Preferably the deep trench is filled with arsenic-doped (As-doped) polysilicon having a thickness of approximately 3000 Å. As-doped polysilicon can be formed by any suitable process such as LPCVD.

Figure 5:
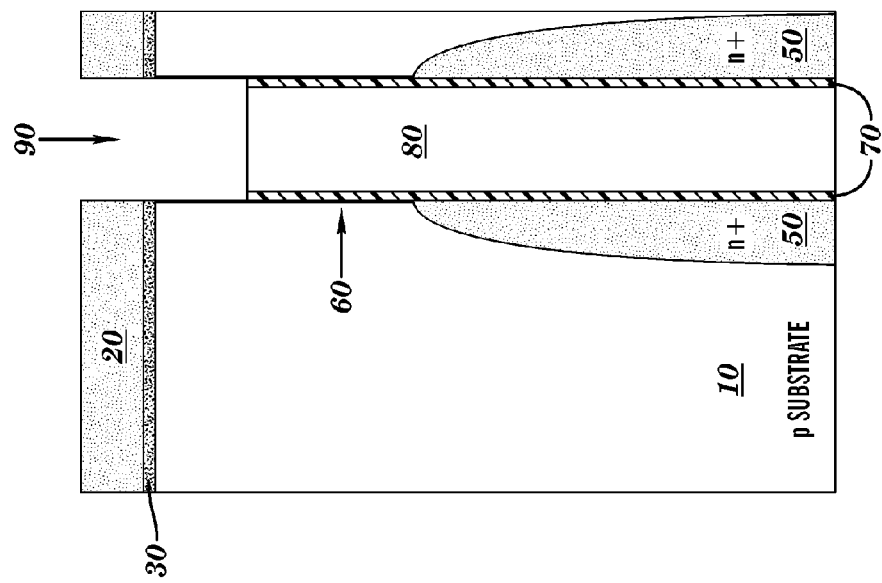

Turning now to FIG. 5, semiconductor substrate 10 is illustrated after As-doped polysilicon 80 has been deposited in deep trench 40.

Returning to FIG. 1, the next step 112 is to recess the filled deep trench and remove the exposed portion of the trench capacitor node dielectric. Preferably, the filled deep trench is recessed approximately 2000 Å below the substrate surface. The filled trench can be recessed using any suitable process such as a RIE. After the filled deep trench has been recessed, the portion of the trench capacitor node dielectric that is exposed after recessing is removed by any suitable process such as a wet etch process.

Figure 6:
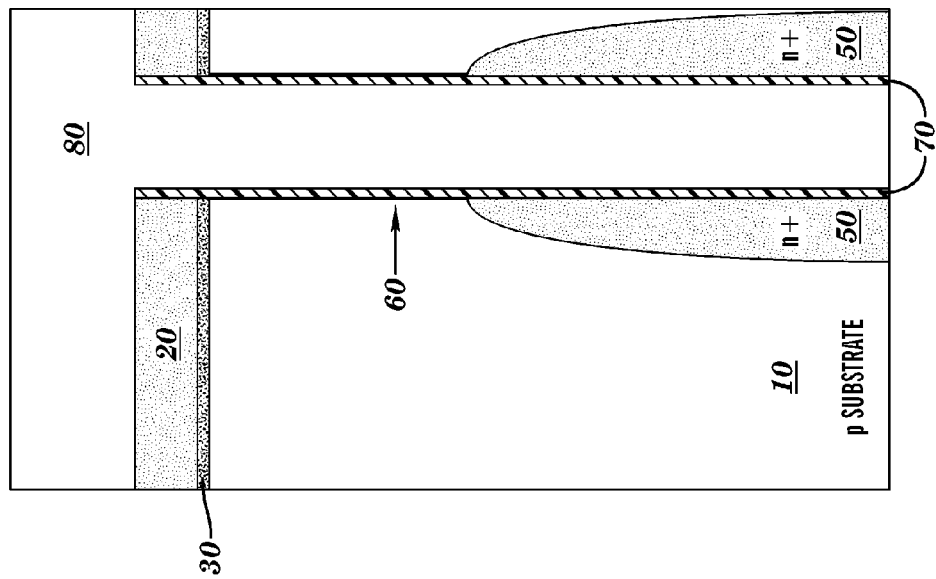

Turning now to FIG. 6, semiconductor substrate 10 is illustrated after trench recess 90 has been formed in polysilicon-filled deep trench 80 and the exposed portion of trench capacitor node dielectric 70 has been removed. The exposed portion of trench capacitor node dielectric 70 is removed to facilitate the formation of a buried strap. The buried strap electrically couples the read/write transfer device of the memory device to the inner node of the trench capacitor as described infra.

Returning to FIG. 1, the next step 114 is to fill the trench recess with a any suitable conductive material such as doped polysilicon, doped germanium, metals, silicides, metallic nitride (e.g., TiN or TaN). Preferably recess 90 is filled with As-doped polysilicon having a thickness of approximately 3000 Å. As-doped polysilicon can be formed by any suitable process such as LPCVD.

Turning now to FIG. 7, semiconductor substrate 10 is illustrated after trench recess 90 has been filled with polysilicon layer 100. Polysilicon layer 100 will form the buried strap as described infra.

Returning to FIG. 1, the next step 116 is to recess the polysilicon layer 100 below the substrate surface to form the buried strap. Preferably, polysilicon layer 100 is recessed approximately 600 Å below the substrate surface. Polysilicon layer 100 can be recessed using any suitable etch process such as RIE.

Turning now to FIG. 8, semiconductor substrate 10 is illustrated after buried strap 110 is formed. Buried strap 110 comprises the portion of polysilicon layer 100 that remains after etching. Buried strap 110 electrically couples the read/write transfer device of the memory device to inner trench capacitor conductor node 112.

Returning to FIG. 1, the next step 118 is to form an insulating region for isolating the trench capacitor from adjacent devices. The insulating region can be any suitable material for isolating adjacent devices such as Shallow Trench Insulator (STI), local oxidation of silicon (LOCOS), or poly-bared LOCOS isolations. Preferably, the insulating region is a STI region.

Figure 9:
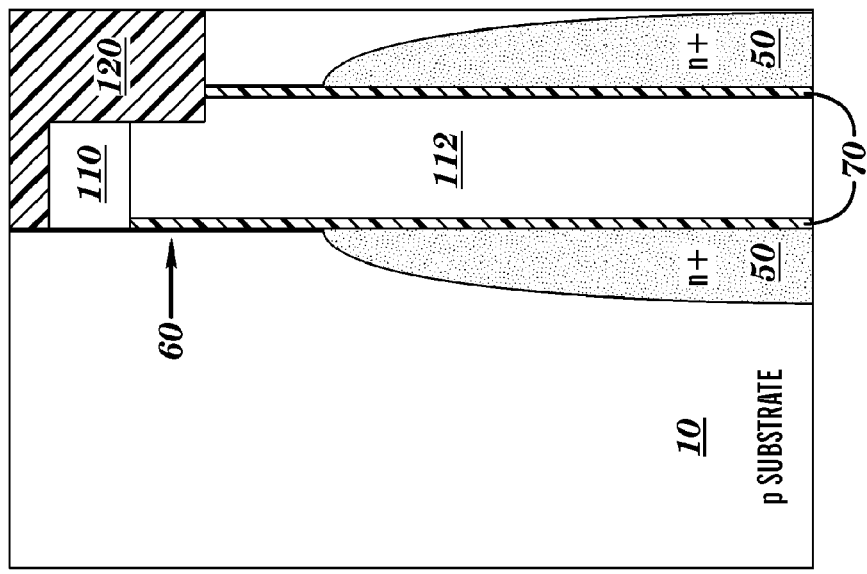

Turning now to FIG. 9, semiconductor substrate 10 is illustrated after STI region 120 is formed. STI region 120 is formed vertically adjacent to and on buried strap 110 and isolates the memory device from adjacent devices (not shown). The adjacent devices can be other memory devices or can be any other device such as logic devices.

Returning to FIG. 1, the next step 120 is to form a buried strap outdiffusion region and a well region. During subsequent thermal processing, dopants, such as arsenic, outdiffuse from the buried strap into the upper substrate region adjacent to the buried strap, thereby forming the buried strap outdiffusion region. The outdiffusion region electrically couples the buried strap to the read/write transfer device of the memory device. The well region can be formed by any suitable processing. For example, portions of the substrate where a dopant is to be implanted can be patterned by any suitable process, and would typically involve the deposition and development of a suitable photoresist. The dopant is then implanted into exposed areas to form the well region. Finally, the patterned photoresist is removed by any suitable photoresist strip process.

The implantation process to create the well region can comprise two or three "deep" implant process steps. Depth of the "deep" implant process steps is preferably 0.15 um to 0.8 um below the substrate surface. For example, to create a p-well that is used to isolate an eDRAM cell from other circuits on an eDRAM chip, the implant process steps would be: (1) a 200 to 260 KeV energy implant having a dose of approximately $2 \times 10^{13}$ to $5.2 \times 10^{13}$ cm$^{-2}$ of B, (2) a 130 to 140 KeV energy implant having a dose of approximately $5 \times 10^{12}$ to $6 \times 10^{12}$ cm$^{-2}$ of B, and (3) a 50 KeV energy implant having a dose of approximately $2 \times 10^{12}$ to $3 \times 10^{12}$ cm$^{-2}$ of B. The depth of the 200 to 260 KeV implant is approximately 6000 Å to 7500 Å below the substrate surface. The depth of the 130 to 140 KeV implant is approximately 4000 Å to 5000 Å below the substrate surface. The 130 to 140 KeV implant is used to enhance lateral isolation (typically targeted just below the STI depth). The depth of the 50 KeV implant is approximately 0.15 um to 0.2 um below the substrate surface. The 50 KeV implant is used to shut off any leakage between the source and drain of the pass-gate device beneath the channel (also referred to as "punchthrough" leakage).

Since the dose of the 200 to 260 KeV implant is the highest amongst the three implants, the 200 to 260 KeV implant will determine the doping of the vertical channel of the vertical parasitic FET. The 200 to 260 KeV implant dose can be used to adjust the Vt of the vertical parasitic FET. The dose of the 200 to 260 KeV implant can be adjusted to prohibit the vertical channel of the parasitic FET from turning on. Therefore, the 200 to 260 KeV implant can complement the formation of a channel stop region or the process to form the channel stop region can be replaced by the 200 to 260 KeV implant. Instead of adjusting the dose of the 200 to 260 KeV implant, an additional implant step can be added to the process for adjusting the Vt of the parasitic FET.

The dose required to raise the Vt of the vertical parasitic FET so that leakage is minimized depends upon the type of material used for the capacitor node dielectric and its thickness. For example, a p-type well implant dose of approximately $7 \times 10^{13}$ cm$^{-2}$ or greater is required for a SiN node dielectric having a thicknesses of approximately 40 Å to 50 Å. Thus, the lower bound of p-type dopant concentration for a 40 Å to 50 Å SiN node dielectric is approximately $3 \times 10^{18}$ to $5 \times 10^{18}$ cm$^{-3}$. The doping level required for an oxide node dielectric is less than that required for SiN. This is so because the fixed charge of an oxide film is typically less than that of a nitride film (the fixed charge of a dielectric will affect the Vt of a device). For high-K dielectrics, Al2O3 is preferably the capacitor node dielectric because the fixed charge of this film is in between thermal oxide and SiN. Also, Al2O3 has a higher epsilon, approximately 10, which is good for scaling of future generations of DRAM/eDRAM cells in that the deep trench does not have to be as deep.

For a variety of suitable capacitor node dielectric materials and range of thicknesses, a 200 to 260 KeV implant having a dose of approximately $2 \times 10^{13}$ to $1.75 \times 10^{14}$ cm$^{-2}$ of B can raise the Vt of the vertical parasitic FET sufficiently such that the high energy implant process can be used in place of the channel stop region for minimizing parasitic current leakage. For such an implant, the p-type concentration of the well region can range from approximately $1 \times 10^{18}$ to $1 \times 10^{19}$ cm$^{-3}$. Alternatively, to complement the formation of a channel stop region, a 40 to 60 KeV tilted sidewall implant conducted in an open trench, having a dose of approximately $2 \times 10^{14}$ to $1 \times 10^{15}$ cm$^{-2}$ of B or BF2, in conjunction with the channel stop region, can adjust the Vt of the parasitic FET sufficiently to minimize parasitic leakage.

As part of the well formation process, a band of dopant is implanted to separate the newly formed well region from the storage capacitor. The band of implanted dopant species (N-band) preferably has a depth of approximately 0.9 um to 1.0 um below the substrate surface. The N-band is formed by implanting a dopant species such as Phosphorous into the substrate at an energy of approximately 1000 KeV. The N-band isolates the p-well region, which will contain the active pass-gate device as described infra, from the storage capacitor. It also is used to connect and contact the outer plate of the trench capacitors so that it may be properly biased (typically, the outer, or buried, plate is tied to ground). The well region is p-type and the N-band is n-type for a p-type substrate. For an n-type substrate, the well region would be n-type and the band of implanted dopant would be p-type (P-band).

Figure 10:
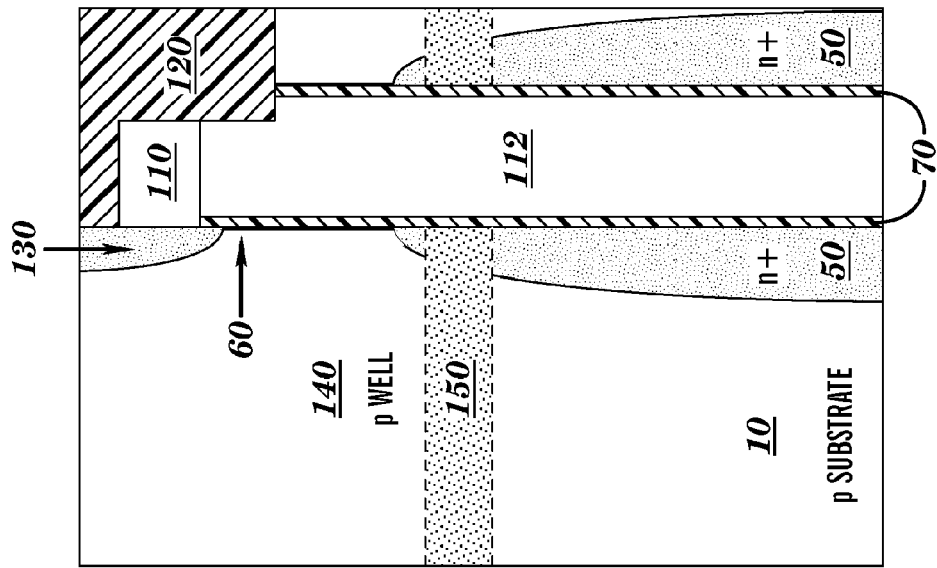

Turning now to FIG. 10, semiconductor substrate 10 is illustrated after outdiffusion region 130 and p-well region 140 have been formed. Outdiffusion region 130 is formed adjacent buried strap 110. P-well region 140 is formed in substrate 10 and is isolated from the storage capacitor by N-band 150. N-band 150 isolates p-well region 140 from buried plate 50. Alternatively, channel stop region 60 is not required if p-well region 140 is doped heavily enough to minimize parasitic leakage as described supra.

Returning to FIG. 1, the next step 122 is to complete the formation of the memory device. The memory device is completed according to conventional processing and includes the formation of an active pass-gate device and bitline. The active pass-gate device and bitline can be formed by any suitable process. Optionally, a passing pass-gate device can be formed. The passing pass-gate device functions as a pass-gate device for an adjacent memory cell.

Figure 11:
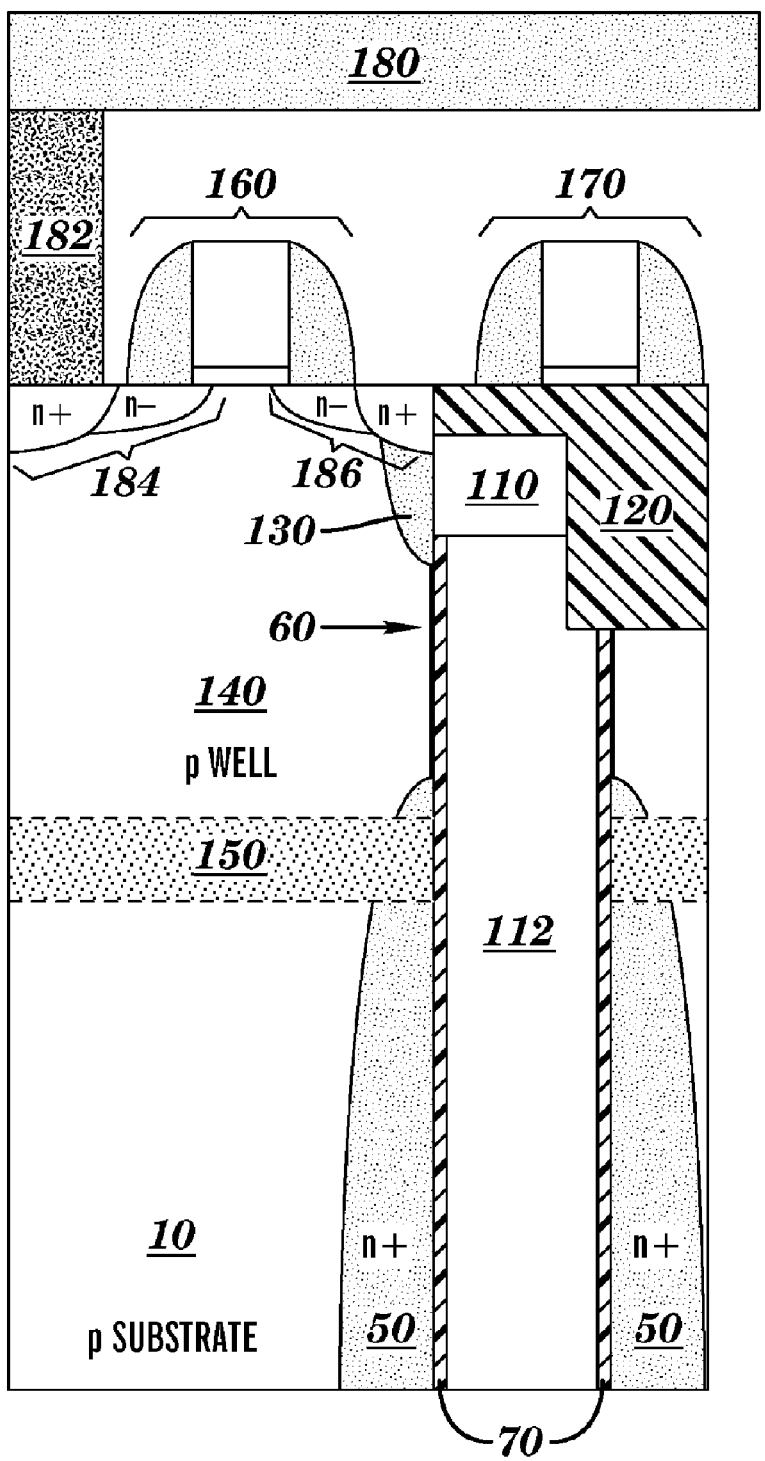

Turning now to FIG. 11, semiconductor substrate 10 is illustrated after the collarless memory device has been formed. The collarless memory device is formed by active pass-gate device 160, bitline 180, bitline contact 182, outdiffusion region 130, buried strap 110, and the trench capacitor. The trench capacitor is formed by buried plate 50, node dielectric 70, and inner node 112. Active pass-gate device 160 can be any suitable device for transferring charge from bitline 180 to the trench capacitor such as a transistor. Pass-gate device 160 is activated by a wordline (not shown). When active pass-gate device 160 is activated (i.e. when the wordline provides a voltage above Vt to the gate of the device), the pass-gate device either charges or discharges the trench capacitor of the present invention in response to the value of bitline 180. Charge is transferred to/from bitline 180 to inner capacitor node 112 through the following current path: bitline 180 to bitline contact 182, bitline contact 182 to a first diffusion region 184 of active pass-gate device 160, first diffusion region 184 to second diffusion region 186 of active pass-gate device 160, second diffusion region 186 to outdiffusion region 130, outdiffusion region 130 to buried strap 110, and buried strap 110 to inner capacitor node 112.

The collarless memory device of the present invention eliminates several process steps that are necessary to form conventional trench DRAM/eDRAM structures. Mainly, the entire collar oxide formation process is eliminated. By eliminating the collar oxide formation process, the following process steps are no longer necessary: (1) collar oxidation along the deep trench sidewall, (2) TEOS deposition, (3) collar anneal, and (4) etch process (e.g. RIE) to etch the collar oxide. Additionally, steps not specifically related to the formation of the collar oxide are also eliminated such as: (a) polysilicon fill, (b) planarization of the polysilicon, (c) polysilicon etch process (e.g. RIE).

As described supra, the present invention thus provides collarless trench semiconductor memory devices having minimized vertical parasitic FET leakage and methods of forming the same for use in memory cells that overcome many of the disadvantages of the prior art. Specifically, the semiconductor devices of the present invention minimize vertical parasitic FET leakage. Additionally, the semiconductor devices of the present invention optimize the diameter of polysilicon-filled trenches, thus minimizing the resistance of the trench. Furthermore, the semiconductor devices of the present invention minimize process complexity and cost. Also, the semiconductor devices of the present invention facilitate scaling of memory cells such as DRAM and eDRAM memory cells.

The embodiments and examples set forth herein were presented in order to best explain the present invention and its practical application and to thereby enable those of ordinary skill in the art to make and use the invention.

However, those of ordinary skill in the art will recognize that the foregoing description and examples have been presented for the purposes of illustration and example only. The description as set forth is not intended to be exhaustive or to limit the invention to the precise form disclosed. Many modifications and variations are possible in light of the teachings above without departing from the spirit and scope of the forthcoming claims. Accordingly, unless otherwise specified, any components of the present invention indicated in the drawings or herein are given as an example of possible components and not as a limitation. Similarly, unless otherwise specified, any steps or sequence of steps of the method of the present invention indicated herein are given as examples of possible steps or sequence of steps and not as limitations.

What is claimed is:

1. A collarless trench semiconductor memory device, comprising:
 a semiconductor substrate;
 a trench formed in the semiconductor substrate;
 a storage capacitor formed within the trench and having a first conductive node, a second conductive node, and a dielectric layer separating the first and second conductive nodes;
 a buried strap formed above the storage capacitor and electrically coupled to the first conductive node;
 an outdiffusion region adjacent the buried strap and electrically coupled to the buried strap; and
 a channel stop region interposed between the outdiffusion region and the second conductive node.

2. The semiconductor memory device of claim 1, wherein the channel stop region is formed by implanting a dopant into the substrate above the second conductive node.

3. The semiconductor memory device of claim 2, wherein the dopant is selected from the group consisting of Boron and $BF_2$.

4. The semiconductor memory device of claim 2, wherein the dopant is implanted at a tilt angle of approximately seven to ten degrees from perpendicular to the substrate.

5. The semiconductor memory device of claim 1, wherein a thickness of the channel stop region is approximately 1 um to 1.5 um.

6. The semiconductor memory device of claim 1, wherein the substrate comprises a material selected from the group consisting of: Si, strained Si, $Si_{1-y}C_y$, $Si_{1-x-y}Ge_xC_y$, $Si_{1-x}Ge_x$, Si alloys, Ge, Ge alloys, GaAs, InAs, InP, III–V semiconductors, and II–VI semiconductors.

7. The semiconductor memory device of claim 1, wherein the first conductive node comprises a material selected from the group consisting of: doped polysilicon, arsenic-doped polysilicon, doped germanium, metals, suicides, and metallic nitrides.

8. The semiconductor memory device of claim 1, further comprising an insulating layer adjacent the buried strap and adapted to isolate the semiconductor memory device from at least one adjacent device.

9. The semiconductor memory device of claim 1, further comprising a doped well region.

10. The semiconductor memory device of claim 9, wherein the doped well region has a dopant concentration of approximately $1\times10^{18}$ to $1\times10^{19}$ cm$^{-3}$ at a depth of approximately 6000 Å to 7500 Å below an upper surface of the substrate.

11. The semiconductor memory device of claim 10, wherein the dopant comprises Boron.

12. The semiconductor memory device of claim 1, further comprising:
 a pass-gate device having first and second diffusion regions, wherein the first diffusion region is electrically coupled to the outdiffusion region;
 a wordline electrically coupled to the pass-gate device and adapted to activate the pass-gate device; and
 a bitline electrically coupled to the second diffusion region of the pass-gate device.

13. The semiconductor memory device of claim 12, further comprising a second pass-gate device electrically isolated from the semiconductor memory device by the insulating layer and adapted to activate an adjacent memory device.

14. A collarless trench semiconductor memory device, comprising:
 a semi conductor substrate;
 a trench formed in the semiconductor substrate;
 a storage capacitor formed within the trench and having a first conductive node, a second conductive node, and a dielectric layer separating the first and second conductive nodes;
 a buried strap formed above the storage capacitor and electrically coupled to the first conductive node;
 an outdiffusion region adjacent the buried strap and electrically coupled to the buried strap; and
 a doped well region formed within the substrate, wherein the doped well region has a dopant concentration of approximately $1\times10^{18}$ to $1\times10^{19}$ cm$^{-3}$ at a depth of approximately 6000 Å to 7500 Å below an upper surface of the substrate.

15. The semiconductor memory device of claim 14, wherein the dopant comprises B.

16. The semiconductor memory device of claim 14, wherein the substrate comprises a material selected from the group consisting of: Si, strained Si, $Si_{1-y}C_y$, $Si_{1-x-y}Ge_xC_y$, $Si_{1-x}Ge_x$, Si alloys, Ge, Ge alloys, GaAs, InAs, InP, III–V semiconductors, and II–VI semiconductors.

17. The semiconductor memory device of claim 14, wherein the first conductive node comprises a material selected from the group consisting of: doped polysilicon, As-doped polysilicon, doped germanium, metals, silicides, and metallic nitrides.

18. The semiconductor memory device of claim 14, further comprising an insulating layer adjacent the buried strap and adapted to isolate the semiconductor memory device from at least one adjacent device.

19. The memory device of claim 14, further comprising:
 a pass-gate device having first and second diffusion regions, wherein the first diffusion region is electrically coupled to the outdiffusion region;
 a wordline electrically coupled to the pass-gate device and adapted to activate the pass-gate device; and
 a bitline electrically coupled to the second diffusion region of the pass-gate device.

20. The memory device of claim 19, further comprising a second pass-gate device electrically isolated from the semiconductor memory device by the insulating layer and adapted to activate an adjacent memory device.

* * * * *